United States Patent

Yumoto et al.

[11] Patent Number: 5,028,111
[45] Date of Patent: Jul. 2, 1991

[54] METHOD OF FIXING CYLINDRICAL OPTICAL PART AND ELECTRIC PART

[75] Inventors: Mitsuru Yumoto, Kita; Takashi Yokota, Yamato, both of Japan

[73] Assignee: Fujitsu Limited, Kawasaki, Japan

[21] Appl. No.: 432,746
[22] PCT Filed: Feb. 14, 1989
[86] PCT No.: PCT/JP89/00146
§ 371 Date: Oct. 16, 1989
§ 102(e) Date: Oct. 16, 1989
[87] PCT Pub. No.: WO89/07779
PCT Pub. Date: Aug. 24, 1989

[30] Foreign Application Priority Data

Feb. 16, 1988 [JP] Japan ................................. 63-33090
Feb. 16, 1988 [JP] Japan ................................. 63-33091
Feb. 16, 1988 [JP] Japan ................................. 63-33092
Feb. 18, 1988 [JP] Japan ................................. 63-36006
Feb. 18, 1988 [JP] Japan ................................. 63-36007

[51] Int. Cl.⁵ ............................................. G02B 6/32
[52] U.S. Cl. ................. 350/96.18; 350/96.2; 350/320
[58] Field of Search ............... 350/96.2, 96.18, 96.15, 350/320; 357/74, 80

[56] References Cited
U.S. PATENT DOCUMENTS 4,874,217 10/1989 Janssen ....................... 350/96.2

FOREIGN PATENT DOCUMENTS 59-215759 12/1984 Japan ................................. 357/80

Primary Examiner—Frank Gonzalez
Assistant Examiner—John Ngo
Attorney, Agent, or Firm—Staas & Halsey

[57] ABSTRACT

According to the present invention, a fixing method by soldering is provided which attains, upon fixing to a substrate a cylindrical optical part which includes a lens, a photo-semiconductor device having a light emitting portion or a light receiving portion located substantially at a focus position of the lens, and terminals connected to the photo-semiconductor device, mechanical fixation of the cylindrical optical part to the substrate and electric connection of the terminals to the substrate at a time. According to another aspect of the present invention, a method of collectively fixing an optical part and an electric part on a substrate by soldering is provided. A heating block is divided into a portion made of a substance having a high coefficient of thermal conductivity and another portion made of another substance having a low coefficient of thermal conductivity. The portion made of the substance having a high coefficient of thermal conductivity is contacted with a reverse face of a portion of a substrate at which an optical part is mounted while the portion made of the substance having a low coefficient of thermal conductivity is contacted with the reverse face of another portion of the substrate at which an electric part is mounted.

11 Claims, 9 Drawing Sheets

A: ELECTRIC PART
B: OPTICAL PART

METHOD OF FIXING CYLINDRICAL OPTICAL PART AND ELECTRIC PART

DESCRIPTION

BACKGROUND OF THE INVENTION

1. Field of the Invention

This invention relates a method of fixing a cylindrical optical part and an electric part, and more particularly to a method of fixing on a substrate a cylindrical optical part which includes a lens, an optical semiconductor element having a light emitting portion or a light receiving portion located substantially at a focus position of the lens, and a terminal.

2. Description of the Related Art

When an optical communication system is to be constructed, various optical devices are required including an optical switch, an optical coupler and an optical beam combining/splitting filter. One of the basic forms of optical devices is a bulk type wherein various optical parts are placed on and fixed to a substrate having a flat face. An optical transmitter-receiver of the bulk type which can be used in bi-directional optical communications includes, for example, a fiber collimator having an end portion of an optical fiber and a collimation or condenser lens fixedly carried thereon, a glass block having a filter film thereon, a PD (photodiode) collimator having a PD chip and a condenser lens fixedly carried thereon, and LED (light emitting diode) collimator or an LD (laser diode) collimator having an LED chip or an LD chip and a collimation lens fixedly carried thereon, and parts of an electric circuit or the like, all mounted on a substrate. In such an optical device, relative positions of individual optical parts placed on and fixed to a substrate have a direct influence on optical coupling efficiency. Accordingly, the individual optical parts must necessarily be fixed in position with a high degree of accuracy. Meanwhile, from the aspect of manufacturing technology, a photo-semiconductor collimator such as a PD collimator or an LED collimator is required not only to be highly accurate in terms of mechanical fixation but also to be readily connect to an electric circuit. Further, in an optical device of the type mentioned, optical parts for optically forming a light path and electric parts for forming an electric circuit are mounted on the same substrate due to a demand for reduction in size of an apparatus and for improvement in S/N ratio. A need exists for a method of fixing such optical parts and electric parts with a high degree of reliability on a substrate.

An optical part such as a PD collimator or an LED collimator commonly has a cylindrical configuration. According to an exemplary one of the known methods of fixing such cylindrical optical or electric parts on a substrate, optical and electric parts are placed on a substrate with a solder layer interposed therebetween. Then, a heating block made of, as, for example, copper is pressed against a rear face of the substrate to melt the solder layer, and thereafter the molten solder is left until it is solidified, thereby collectively fixing the optical and electric parts to the substrate by soldering. In this instance, in order to achieve positioning of the optical parts with a high degree of accuracy, for example, a positioning jig having a V-shaped groove or grooves formed thereon is pressed against the cylindrical optical parts from the side opposite to the substrate to position the optical parts. Meanwhile, the heating block is placed on a hot plate heated to 240° to 250° C. so that heat may be transmitted by heat conduction to the substrate and the solder layer by way of the heating block thereby to collectively fix the optical parts and the electric parts by soldering.

However, according to the conventional soldering fixing method, terminals of the optical parts cannot be fixed simultaneously with mechanical fixation of the optical parts to the substrate. Thus, after the optical parts are fixed to the substrate by soldering, the terminals of the optical parts are bent until ends thereof are contacted with a wiring pattern formed on the substrate. Then, the terminals are connected to the wiring pattern by means of a soldering iron after the substrate has been heated by the hot plate to a temperature at which the mechanically soldered portions may not be melted, for example, to 100° C.

With such conventional fixing method, however, since mechanical fixation and electrical connection of the cylindrical optical parts must necessarily be carried out separately, there is a problem that the manufacturing operation process is complicated. To the contrary, if heating by means of the hot plate in electrical connection is omitted in order to simplify the process, where a ceramic substrate is employed, there is a problem that a crack may occur in the substrate or electric connection may become uncertain due to local heating by means of the soldering iron.

Meanwhile, such a conventional collective soldering fixing method of optical parts and electric parts as described above which utilizes a hot plate and a heating block has a disadvantage that, since generally the heat capacity of optical parts is very great compared with the heat capacity of electric parts, if heat of the hot plate is transmitted to a substrate using a heating block of the same material in order to fix the electric parts sufficiently firmly to the substrate, then an excessively large amount of heat will be applied to the electric parts. In other words, there is a disadvantage that, since the electric parts have a longer thermal load period of time at a temperature at which solder is melted, an excessively large amount of heat is applied to the electric parts, which is not preferable for the reliability of the electric parts.

SUMMARY OF THE INVENTION

Accordingly, it is an object of the present invention to provide a method of fixing a cylindrical optical part having terminals which overcomes such drawbacks of the prior art described above and is capable of achieving mechanical fixation and electric connection of cylindrical optical parts to a substrate readily and with certainty.

Another object of the present invention is to provide a method of fixing optical parts and electric parts collectively by soldering which is capable of reducing a thermal load to the electric parts.

According to one aspect of the present invention, there is provided a fixing method by which a cylindrical optical part which includes a lens, a photo-semiconductor device having a light emitting portion or a light receiving portion located substantially at a focus position of the lens, and terminals connected to the photo-semiconductor device is mechanically fixed to the substrate and at the same time the terminals are electrically connected to the substrate. The method comprises the steps of forming on the substrate terminal arresting portions each having a wiring pattern, bending the terminals such that each end portion thereof may be arrested at the respective terminal arresting portions, providing solder at a location of the substrate around the terminal arresting portions and another location of the substrate at which the cylindrical optical part is mounted, positioning and holding the cylindrical optical part on the substrate by means of a positioning jig having a V-shaped groove formed thereon with the solder interposed between the cylindrical optical part and the substrate, heating the cylindrical optical part and the substrate in an integral relationship to melt the solder, and leaving the cylindrical optical part and the substrate until the melted solder is solidified, thereby fixing the cylindrical optical part to the substrate and simultaneously connecting the terminals of the cylindrical optical part to the terminal arresting portions of the substrate.

In place of the terminal arresting portions on the substrate described above, a terminal pressing portion may be formed in an integral relationship on the positioning jig such that the cylindrical optical part may be positioned and held on the substrate by means of the positioning jig with solder interposed therebetween and simultaneously the terminals extending from the cylindrical optical part may be bent by means of the terminal pressing portion of the positioning jig to press end portions of the terminals against wiring patterns on the substrate with the solder interposed therebetween. Preferably, the terminal pressing portion of the positioning jig has a number of grooves formed thereon which number is equal to the number of the terminals of the cylindrical optical part to be fixed.

In place of formation of the terminal pressing portion in an integral relationship on the positioning jig, a separate terminal pressing member may be used such that electric connection of the terminals of the cylindrical optical part may be attained at the same time with mechanical fixation of the cylindrical optical part while the terminal pressing member is contacted with wall faces of a V-shaped groove formed on the positioning jig.

According to another aspect of the present invention, there is provided a cylindrical optical part which comprises a cylindrical lens holder, a lens held on the lens holder, a photo-semiconductor device having a light emitting portion or a light receiving portion located substantially at a focus position of the lens, and terminals of the photo-semiconductor device extending outwardly through a cylindrical wall of the lens holder in a direction perpendicular to an optical axis of the photo-semiconductor device.

In order to fix the cylindrical optical part to a substrate by soldering, recesses are formed at locations of the substrate at which the terminals of the cylindrical optical part are to contact with the substrate so that mechanical fixation of the cylindrical optical part and electric connection of the terminals of the cylindrical optical part may be attained at a time by soldering.

According to a further aspect of the present invention, there is provided a method of fixing a cylindrical optical part and an electric part collectively on a substrate by soldering, which method comprises the steps of providing solder at a location of the substrate at which the cylindrical optical part is mounted and another location of the substrate at which the electric part is mounted, positioning and holding the cylindrical optical part on the substrate by means of a positioning jig having a V-shaped groove formed thereon with solder interposed between the cylindrical optical part and the substrate, mounting the electric part on the substrate with solder interposed therebetween, contacting a heating block composed of a portion made of a substance having a high coefficient of thermal conductivity and another portion made of another substance having a low coefficient of thermal conductivity with a rear face of the substrate such that the portion made of the substance having a high coefficient of thermal conductivity may contact with the reverse face of a location of the substrate at which the cylindrical optical part is mounted and the portion made of the substance having a low coefficient of thermal conductivity may contact with the reverse face of another location of the substrate at which the electric part is mounted, heating the solder by a heating means by way of the heating block and the substrate to melt the solder, and leaving the cylindrical optical part, the electric part and the substrate until the melted solder is solidified, thereby fixing the cylindrical optical part and the electric part to the substrate collectively by soldering.

The heating block can be constituted either by joining the portion made of the substance having a high coefficient of thermal conductivity and the portion made of the substance having a low coefficient of thermal conductivity to each other by brazing or welding or by force fitting one of the substance portions into the other substance portion.

BEST MODE FOR CARRYING OUT THE INVENTION

Figure 1:
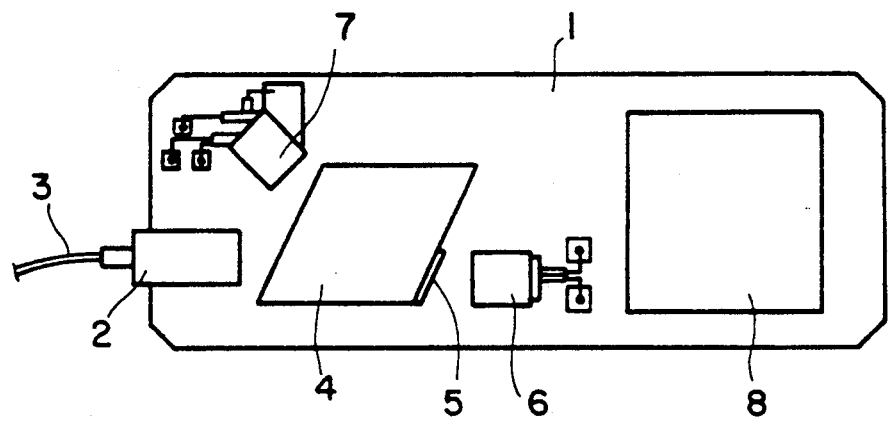
FIG. 1 is a plan view of a transmitter-receiver of the bulk type.

In the following, the present invention will be described in detail in connection with embodiments thereof shown in the drawings.

Referring first to FIG. 1, there is shown a plan view of an optical transmitter-receiver which can be used for bi-directional optical communications to which the present invention can be applied. The transmitter-receiver includes a fiber collimator 2 having an end portion of an optical fiber 3 and a collimation or condenser lens fixedly carried thereon, a glass block 4 having a filter film 5 thereon, a PD (photodiode) collimator 6 having a PD chip and a condenser lens fixedly carried thereon, an LED (light emitting diode) collimator or LD (laser diode) collimator 7 having an LED chip or an LD chip and a collimation lens fixedly carried thereon, and an electric part 8. All those elements are mounted on a ceramic substrate 1.

Light projected from the fiber collimator 2 and passing through the filter film 5 is photo-electrically converted by the PD collimator 6. Meanwhile, emergent light from the LED collimator 7 which is electro-optically converted from a transmission signal is reflected by the filter film 5 and introduced into the fiber collimator 2. With such optical device, since a relative positional relationship of the individual optical parts placed on and fixed to the ceramic substrate 1 has a direct influence on the optical coupling efficiency, the individual parts must necessarily be positioned with a high degree of accuracy. Meanwhile, from the aspect of manufacturing technology, the photo-semiconductor collimators such as the PD collimator and the LED collimator are required not only to be high in accuracy in mechanical fixation but also to be readily connected to an electric circuit.

Figure 2:
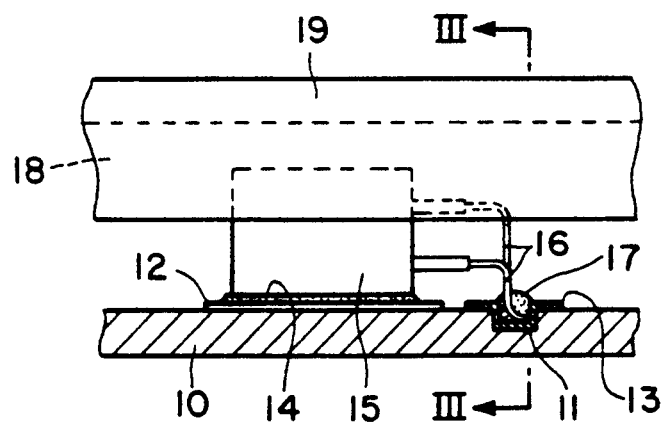
FIG. 2 is a partial sectional view showing an embodiment of the present invention.
Figure 3:
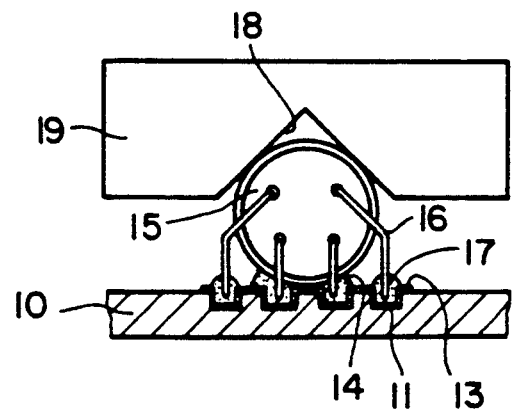
FIG. 3 is sectional view taken along line III—III of FIG. 2.
Figure 4:
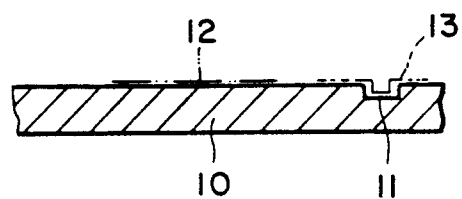
FIG. 4 is an illustrative view showing formation of a metal layer and a wiring pattern on a substrate.

At first, a method of the present invention for fixing optical parts to a substrate by soldering will be described with reference to FIGS. 2 to 15. FIG. 2 is a partial sectional view showing an arrangement of various parts before soldering, and FIG. 3 is a sectional view taken along line III—III of FIG. 2. In the embodiment shown, prior to arranging the individual parts, a metal layer 12 for soldering is formed at a location of a substrate 10 at which a cylindrical photo-semiconductor collimator is to be positioned, as shown in FIG. 4. The substrate 10 has arresting portions 11 formed as recesses thereon. Then, a wiring pattern 13 for electric connection is formed on the respective arresting portions 11 of the substrate 10. A ceramic material such as alumina may be used as a material of the substrate 10 while the metal layer 12 and the wiring pattern 13 can be obtained by formation of a layer of solderable metal such as gold (Au) by a thin film forming technique such as vapor deposition.

Referring to FIGS. 2 and 3, a photo-semiconductor collimator 15 is placed on the metal layer 12 with a paste solder layer 14 interposed therebetween, and several terminals 16 of the photo-semiconductor collimator 15 are bent such that end portions thereof may contact with the respective wiring patterns 13 on the arresting portions 11 of the substrate 10. Paste solder 17 is filled in the arresting portions 11 of the substrate 10 in which the terminals 16 are arrested. In this condition, the photo-semiconductor collimator 15 is positioned using a positioning jig 19 having a V-shaped groove 18 formed thereon. As a result, the arrested condition of the terminals 16 of the photo-semiconductor collimator 15 is also stabilized. Thus, the substrate 10, photo-semiconductor collimator 15 and positioning jig 19 are heated in an integral relationship to melt the paste solder blocks 14 and 17 to carry out mechanical fixation of the photo-semiconductor collimator 15 and electric connection of the terminals 16 of the photo-semiconductor collimator 15 at one time.

Figure 5A:
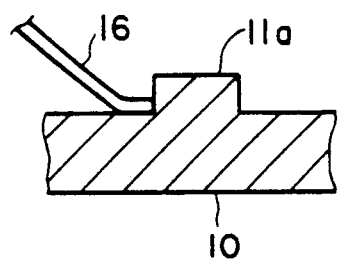
FIG. 5A is a sectional view showing another construction of an arresting portion according to the present invention.
Figure 5B:
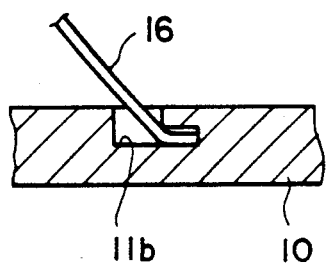
FIG. 5B is a sectional view showing a further construction of an arresting portion according to the present invention.

FIG. 5A is a sectional view of part of a modification to the substrate 10 described above. The modified substrate also denoted at 10 adopts arresting portions 11a in the form of projections or ribs in place of the arresting portions 11 in the form of recesses described above. FIG. 5B shows another modification wherein arresting portions 11b are in the form of L-shaped recesses such that ends of the terminals 16 of the photo-semiconductor collimator 15 may be held in up and down directions in the arresting portions 11b so that they may not readily be released from the arresting portions 11b. Generally, the arresting portions of the substrate 10 may have any shape only if terminals of a photo-semiconductor collimator may not be released readily therefrom when the photo-semiconductor collimator is placed in position on the substrate.

Figure 6A:
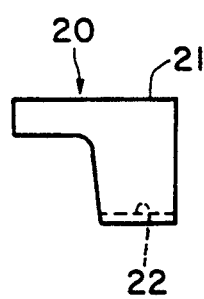
FIG. 6A is a side elevational view of a terminal pressing member which can be used in carrying out the present invention.
Figure 6B:
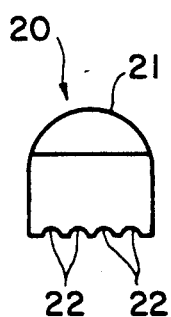
FIG. 6B is a rear elevational view of the terminal pressing member of FIG. 6A.
Figure 6C:
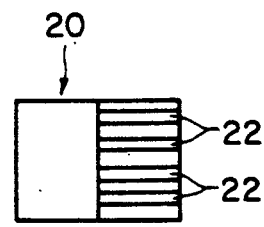
FIG. 6C is a bottom plan view of the terminal pressing member of FIG. 6A.

Another embodiment of the present invention wherein a terminal pressing member is employed will be described subsequently with reference to FIGS. 6A to 9C. FIG. 6A is a side elevational view of a terminal pressing member which can be used in carrying out the present invention, and FIGS. 6B and 6C are a rear elevational view and a bottom plan view of the terminal pressing member. The terminal pressing member 20 has a semi-cylindrical upper face 21 for contacting with a V-shaped groove of a positioning jig which will be hereinafter described, and a plurality of (4 in the case of the terminal pressing member 20 shown) grooves 22 corresponding to the number of terminals of a photo-semiconductor collimator to be fixed are formed on a lower face of the terminal pressing member 20. The terminal pressing member 20 may be made of stainless steel such as SUS303 (Japanese Industrial Standards) or TEFLON (trade name) which is not deformed at a temperature for soldering and has a relatively low wetting property to molten solder.

Figure 7A:
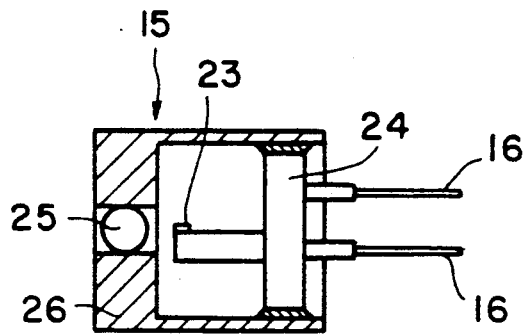
FIG. 7A is a sectional view of a cylindrical optical part which can be used in carrying out the present invention.
Figure 7B:
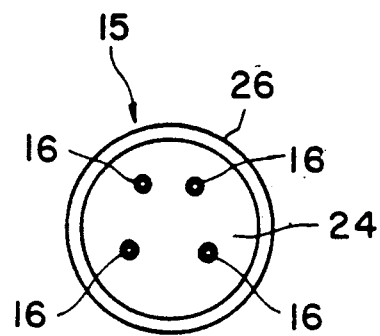
FIG. 7B is a rear elevational view of the cylindrical optical part of FIG. 7A.

FIG. 7A is a sectional view of a photo-semiconductor collimator which can be used in carrying out the present invention, and FIG. 7B is a rear elevational view of the photo-semiconductor collimator. The photo-semiconductor collimator 15 is constituted such that a holding portion 24 on which a photo-semiconductor device 23 such as an LD chip and terminals 16 electrically connected to the photo-semiconductor device 23 are fixedly carried is inserted in a lens holder 26 to which a lens 25 is fixed by force fitting, and the holding portion 24 is integrally fixed to the lens holder 26 at a location at which predetermined optical conditions are satisfied. The lens holder 26 may be formed from a solderable metal, or otherwise, a layer of solderable metal may be provided on a surface of the lens holder 26.

Figure 8:
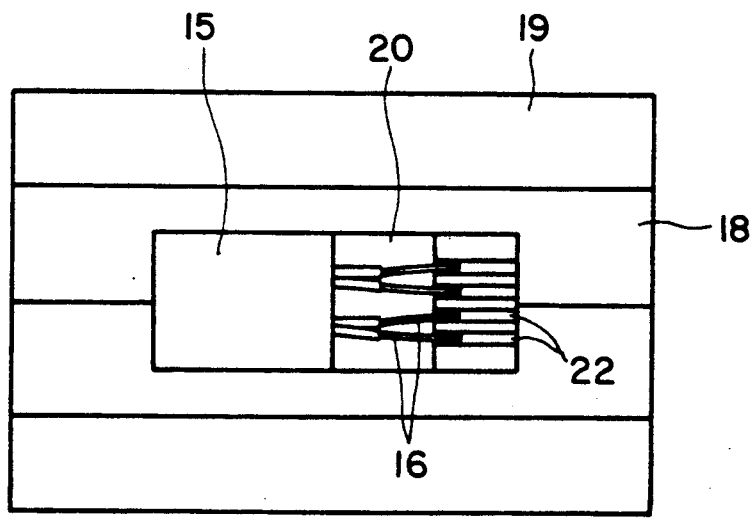
FIG. 8 is a plan view showing a terminal pressing member and a cylindrical optical part placed on a positioning jig having a V-shaped groove formed thereon.

FIG. 8 is a plan view of the terminal pressing member 20 and the photo-semiconductor collimator 15 described above which are placed on a positioning jig 19 which has a V-shaped groove 18 formed thereon. The photo-semiconductor collimator 15 is contacted at a cylindrical side face thereof with the opposite wall faces of the V-shaped groove 18 of the positioning jig 19 while the terminal pressing member 20 is contacted at the semi-cylindrical upper face thereof with the opposite wall faces of the V-shaped groove 18. The and the terminals 16 extending in the direction of an optical axis of the photo-semiconductor collimator 15 are bent and arrested at grooves 22 of the terminal pressing member 20. Since the terminal pressing member 20 has a plurality of such grooves 22 corresponding to the number of terminals of the photo-semiconductor collimator 15, the individual terminals 16 can be disposed individually in position on the terminal pressing member 20.

Figure 9A:
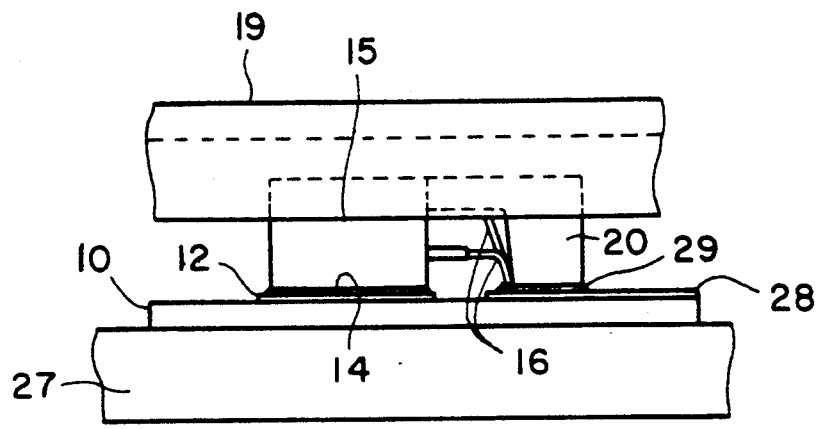
FIG. 9A is a side elevational view showing a cylindrical optical part being fixed to a substrate using a terminal pressing member.
Figure 9B:
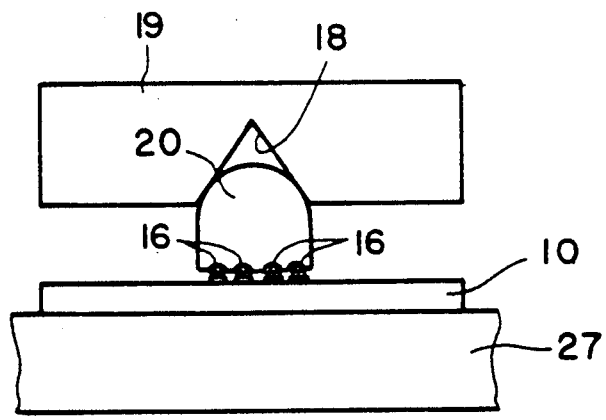
FIG. 9B is a rear elevational view of the cylindrical optical part shown in FIG. 9A.
Figure 9C:
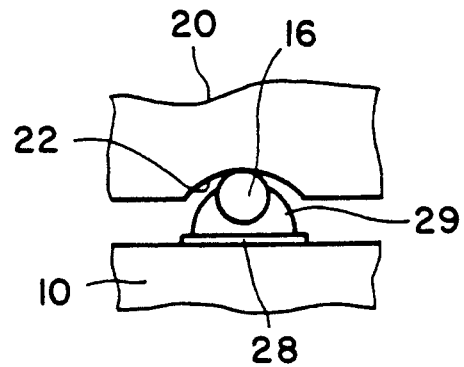
FIG. 9C is a partial enlarged view of the cylindrical optical part shown in FIG. 9B.

FIGS. 9A and 9B are a side elevational view and a rear elevational view showing the manner in which the cylindrical photo-semiconductor collimator is mechanically fixed to the substrate and at the same time terminals thereof are connected to the wiring patterns on the substrate using the terminal pressing member in which FIG. 9C is a partial enlarged view of FIG. 9B. A substrate 10 to which the photo-semiconductor collimator 15 is to be fixed is supported in parallel to the positioning jig 19 while it is pressed against the photo-semiconductor collimator 15 and the terminal pressing member 20 which are disposed in such a manner as shown in FIG. 8, and the entire set with the substrate 10 directed on the lower side is heated by means of a hot plate 27. A metal layer 12 is formed at a location of the substrate 10 to which the photo-semiconductor collimator 15 is to be fixed. Paste solder 14 is interposed between the metal layer 12 and the photo-semiconductor collimator 15. For the individual terminals 16 of the photo-semiconductor collimator 15, wiring patterns 28 to be connected to the terminals 16 are formed on the substrate 10 by a similar means to the metal layer 12. Paste solder 29 is interposed between the wiring patterns 28 and the terminals 16.

When soldering is to be carried out with the individual members disposed in such a positional relationship as described above, it is required to press the positioning jig 19 toward the substrate 10 with a certain magnitude of force in order to position the photo-semiconductor collimator 15 at a predetermined position on the substrate 10 with a high degree of accuracy. Since the pressing force then acts by way of the terminal pressing member 20 in a direction in which the terminals 16 are closely contacted with the wiring patterns 28, effective soldering can be attained between the terminals 16 and wiring patterns 28.

Figure 10:
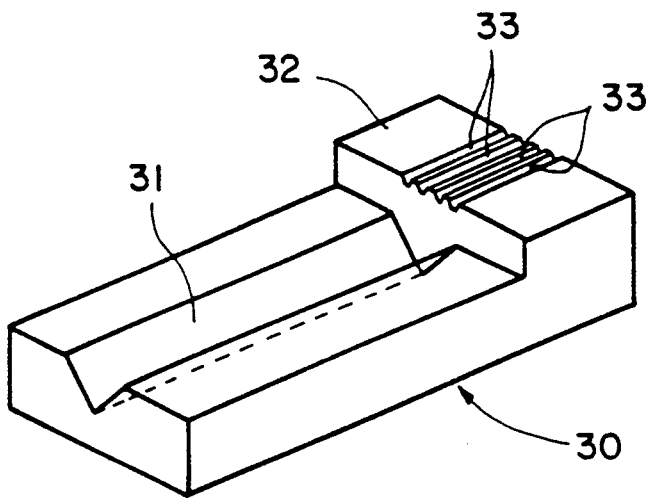
FIG. 10 is a perspective view of a positioning jig on which a terminal pressing portion is formed in an integral relationship.

Referring now to FIG. 10, there is shown a perspective view of another positioning jig which can be used in carrying out the present invention. The positioning jig shown is an integrated structure of the terminal pressing member 20 and the positioning jig described hereinabove. The positioning jig 30 has a V-shaped groove 31 formed at a flat plate portion thereof, and a terminal pressing portion 32 is formed adjacent an end portion of the V-shaped groove 31 in an integral relationship on the positioning jig 30. A plurality (four in the case of the positioning jig 30 shown) grooves 33 corresponding to the number of terminals of a photo-semiconductor collimator to be fixed are formed on a flat face of the terminal pressing portion 32 of the positioning jig 30. The terminal pressing portion 32 may be formed from stainless steel such as SUS303 or TEFLON similarly to the terminal pressing member 20 described above.

Figure 11:
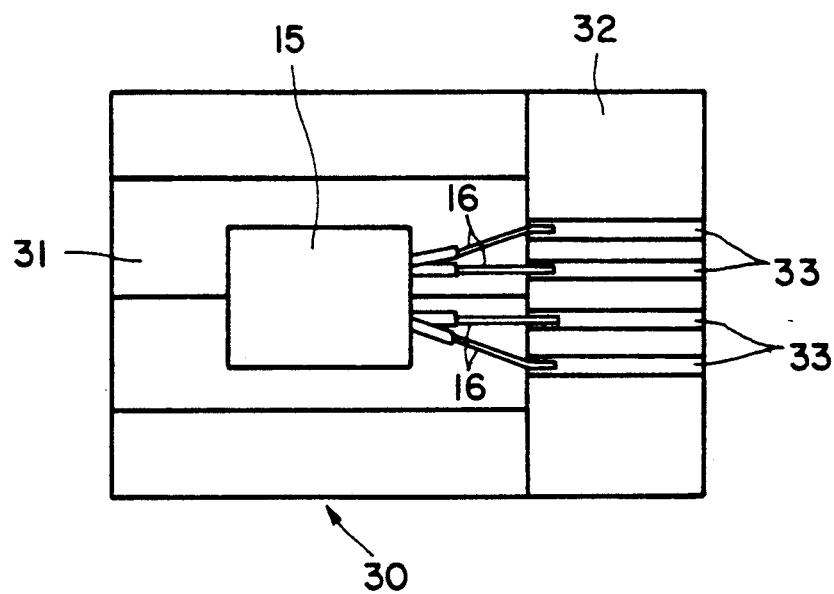
FIG. 11 is a plan view of a cylindrical optical part placed on the positioning jig shown in FIG. 10.

FIG. 11 is a plan view showing a photo-semiconductor collimator 15 placed in the V-shaped groove 31 of the positioning jig 30. The photo-semiconductor collimator 15 is contacted at a cylindrical side face thereof with the opposite wall faces of the V-shaped groove 31 of the positioning jig 30, and terminals 16 extending in the direction of an optical axis of the photo-semiconductor collimator 15 are bent and arrested in the grooves 33 of the terminal pressing portion 32 of the positioning jig 30. Since the positioning jig 30 has a plurality such grooves 33 corresponding to the number of the terminals 16 of the photo-semiconductor collimator 15, the individual terminals can be positioned at individually predetermined positions.

Figure 12A:
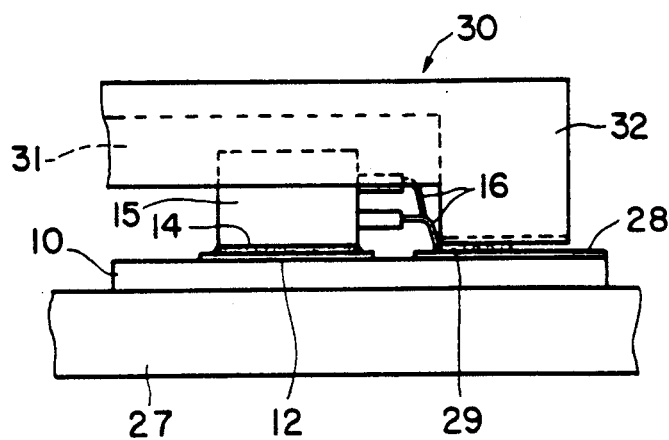
FIG. 12A is a side elevational view showing a cylindrical optical part being fixed to a substrate using the positioning jig shown in FIG. 10.
Figure 12B:
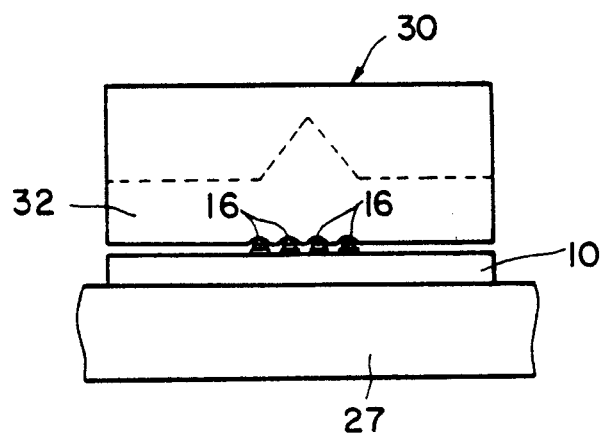
FIG. 12B is a rear elevational view of the cylindrical optical part of FIG. 12A.

FIGS. 12A and 12B are a side elevational view and a rear elevational view, respectively, showing a manner in which a photo-semiconductor collimator is fixed to a substrate using the positioning jig of FIG. 11. The fixing method in this instance is similar in arrangement to the fixing method shown in FIGS. 9A to 9C. Accordingly, substantially like components are denoted by like reference numerals, and a detailed description thereof will be omitted herein to avoid redundancy.

When soldering is to be carried out with individual parts arranged in such a positional relationship as described hereinabove, it is required to press the positioning jig 30 against the substrate 10 with a certain magnitude of force similarly as in the method illustrated in FIGS. 9A to 9C in order to position the photo-semiconductor collimator 15 at a predetermined location on the substrate 10 with a high degree of accuracy. Since the pressing force acts by way of the terminal pressing portion 32 of the positioning jig 30 in a direction in which the terminals 16 are closely contacted with wiring patterns 28 on the substrate 10, effective soldering can be attained between the terminals 16 and wiring patterns 28.

Figure 13:
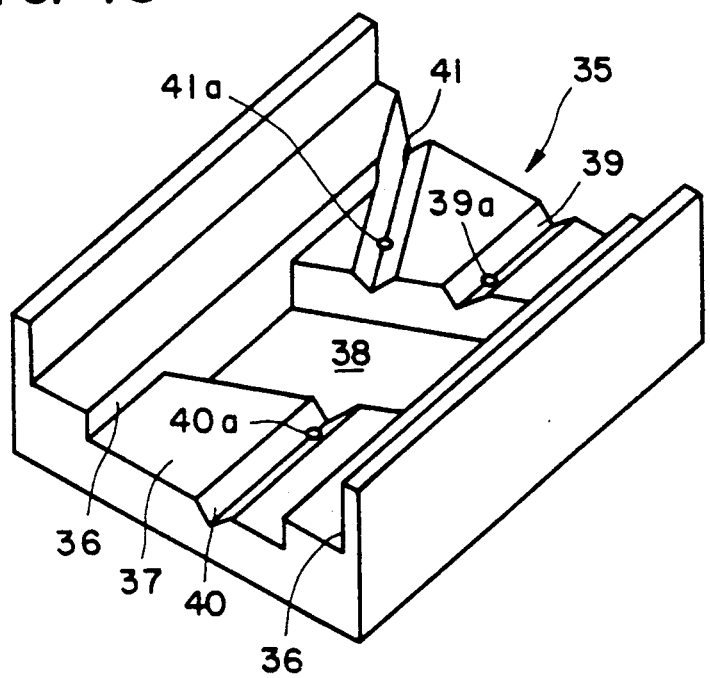
FIG. 13 is a perspective view of a positioning jig suitable for positioning three cylindrical optical parts shown in FIG. 1 on a substrate.

While the embodiments described above are shown involving only one photo-semiconductor collimator, actually a plurality of V-shaped grooves corresponding to a plurality of cylindrical optical parts are formed on a positioning jig so that individual cylindrical optical parts may be fixed at a time to a substrate by soldering. For example, such a positioning jig as shown in FIG. 13 is used for positioning of the individual parts of the optical device shown in FIG. 1. Referring to FIG. 13, the positioning jig 35 shown has a step 36 for accommodating the substrate 1, and a recess 38 for positioning the glass block 4 and V-shaped grooves 39, 40 and 41 for positioning the fiber collimator 2, PD collimator 6 and LED collimator 7, respectively, are formed on a bottom wall 37 of the positioning jig 35. Pin holes 39a, 40a and 41a into which positioning pins are to be inserted are provided in the V-shaped grooves 39, 40 and 41, respectively. By inserting such pins into the pin holes 39a, 40a and 41a of the V-shaped grooves 39, 40 and 41 and contacting the fiber collimator 2, PD collimator 6 and LED collimator 7 from the outside with the pins within the V-shaped grooves 39, 40 and 41, respectively, the individual collimators 2, 6 and 7 can be positioned readily. The glass block 4 is fitted into the recess 38 of the positioning jig 35 for positioning thereof with respect to the collimators 2, 6, and 7.

After the individual optical parts are positioned in this manner, a substrate having solder paste applied to predetermined locations thereof is placed from above on the positioning jig 35 with its solder paste applied face directed downwardly. In this condition, the substrate is accommodated within the step 36 of the positioning jig 35. Further, a heating block is placed from above and fixed to the positioning jig 35 by means of screws. The entire unit is put upside down and placed on a hot plate with the heating block thereof contacting with the hot plate to carry out soldering of the individual optical parts by means of the hot plate. It is to be noted that, while in any of the embodiments described above the substrate is placed directly on the hot plate, it is desirable in an actual operation to place a substrate on a hot plate with a heating block interposed therebetween.

Figure 14A:
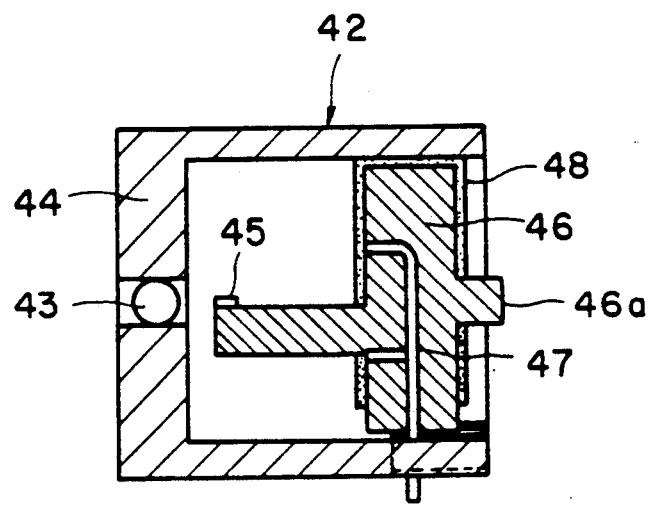
FIG. 14A is a sectional view of a photo-semiconductor collimator constructed according to the present invention.
Figure 14B:
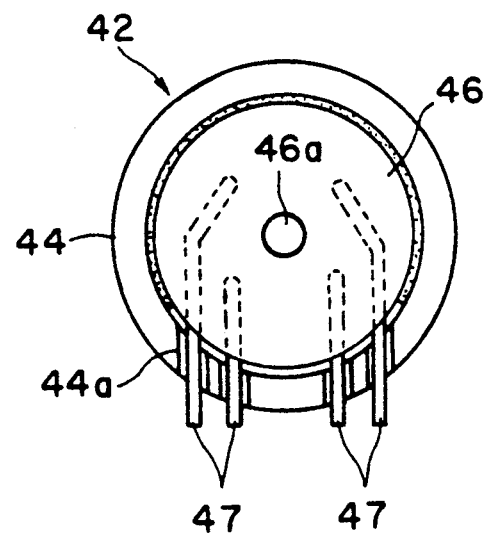
FIG. 14B is a rear elevational view of the photo-semiconductor collimator of FIG. 14A.

Subsequently, a form of a photo-semiconductor collimator which is suitable for a fixing method of the present invention will be described with reference to FIGS. 14A and 14B. FIGS. 14A and 14B are a cross sectional view and a rear elevational view of a photo-semiconductor collimator 42. The photo-semiconductor collimator 42 includes a lens holder 44 to which a spherical lens 43 is fixed by force fitting, and a stem 46 having a photo-semiconductor device 45 fixedly carried thereon at a focus position of the lens 43. The lens holder 44 and the stem 46 are fixed in an integral relationship to each other by means of solder 48 of a high melting point. Four terminals 47 are embedded in the stem 46 and extend outwardly from a side portion of the stem 46. The terminals 47 are electrically connected to the photo-semiconductor device 45. The lens holder 44 has four slits 44a formed at locations thereof corresponding to the terminals 47 of the lens holder 44, and the terminals 47 extend outwardly through the slits 44a.

Such photo-semiconductor collimator 42 is produced by the following method. At first, the stem 46 to which the photo-semiconductor device 45 is fixed is loosely fitted in the lens holder 44 to which the spherical lens 43 is fixed by force fitting, and a solder element of a high melting point having a substantially annular ring-like configuration is interposed in a gap between the stem 46 and the lens holder 44. Subsequently, a projection 46a formed on a rear face of the stem 46 is fixed to a fine adjusting table or the like to adjust a relative positional relationship between the stem 46 and the lens holder 44 by means of the fine adjusting table to effect focusing and alignment adjustments of the collimator. Then, after completion of such adjustments, the solder of a high melting point is melted by high frequency heating to effect fixation by soldering. According to the process of production, since an optimum positional relationship between the lens 43 and the photo-semiconductor device 45 can be attained readily, an optical device having a high optical coupling efficiency can be provided. It is to be noted that the stem 46 may be suitably formed from a member of ceramic materials having a metal layer formed on a soldering portion thereof. Where the stem 46 is made of a ceramic material, radiation of heat upon soldering is improved.

Figure 15:
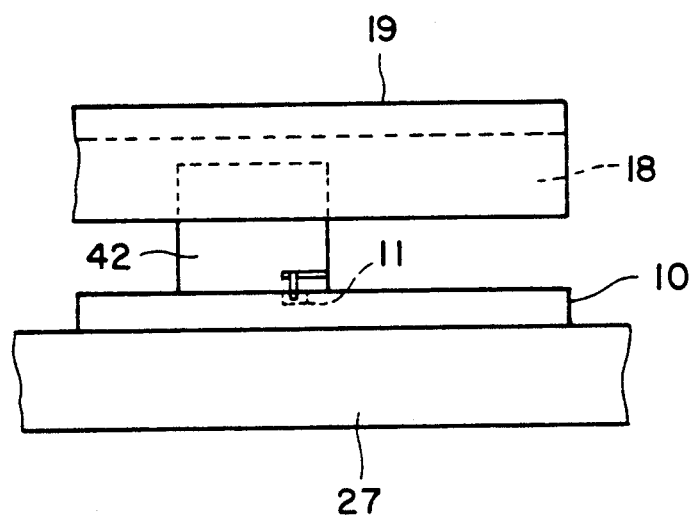
FIG. 15 is an illustrative view showing a method of fixing the photo-semiconductor collimator of FIGS. 14A and 14B to a substrate.

FIG. 15 is an illustrative view of a condition in which the photo-semiconductor collimator 42 described hereinabove is fixed to the substrate 10. Recesses 11 similar to those shown in FIG. 2 and acting as terminal arresting portions are formed in the substrate 10. Wiring patterns are formed in the recesses 11, and if the photo-semiconductor collimator 42 is positioned by the positioning jig 19 and placed on the substrate 10, the terminals 47 of the photo-semiconductor collimator 42 are arrested in the recesses 11 of the substrate 10. Consequently, fixation of the photo-semiconductor collimator 42 and electric connection of the terminals 47 of the photo-semiconductor collimator 42 can be attained at one time.

Figure 16:
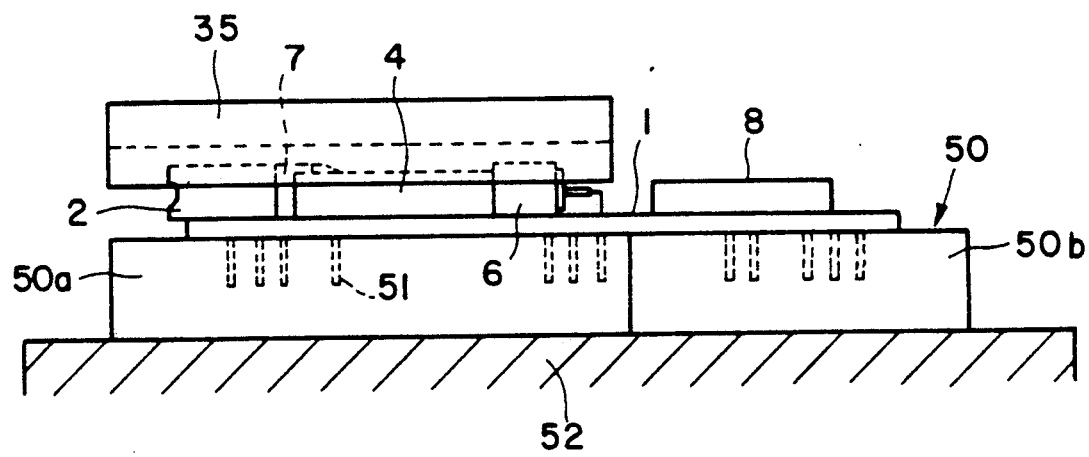
FIG. 16 is an illustrative view showing optical parts and electric parts collectively fixed by soldering to a substrate according to the present invention.

While each of the embodiments described above relates to a method of fixing a cylindrical optical part to a substrate, a method of fixing an optical part or parts and an electric part or parts to a substrate collectively by soldering, which is another aspect of the present invention, will be described subsequently with reference to FIG. 16. FIG. 16 is an illustrative view illustrating a method of fixing the optical transmitter-receiver shown in FIG. 1. A metal layer is formed, for example, by metallization processing at each of locations on a ceramic substrate 1 at which the optical parts 2, 4, 6 and 7 and the electric part 8 are to be seated and wiring patterns are to be formed, and paste solder is applied to each of the metal layers. While the fiber collimator 2, PD collimator 6 and LED collimator 7 must necessarily be positioned with a high degree of accuracy on the ceramic substrate 1, since such optical parts have a cylindrical configuration, if the optical parts are placed, using the positioning jig 35 shown in FIG. 13 which has a plurality of V-shaped grooves formed thereon, on the positioning jig 35 and then the ceramic substrate having paste solder applied to locations to which the optical parts are to be fixed is placed on the optical parts, then the individual optical parts are positioned with a high degree of accuracy and temporarily fixed to the predetermined locations by the adherent force of the paste solder. Then, a heating block 50 is further placed on the substrate 1, and then the entire block is secured by means of screws (not shown), whereafter the entire block is put upside down so as to attain such a condition as shown in FIG. 16. In this condition, the electric part 8 is temporarily fixed to a predetermined position by the adherent force of the paste solder.

After the ceramic substrate 1 is placed in this manner on the heating block 50, the heating block 50 is further placed on a hot plate 52 to heat the optical parts 2, 4, 6 and 7 and the electric part 8 from the rear face of the ceramic substrate 1. Afterwards, the entire block is left so as to be cooled, thereby fixing those parts to the ceramic substrate 1 by soldering. The heating block 50 may be composed of a metal block 50a made of a metal having a high coefficient of thermal conductivity such as, for example, aluminum, and another metal block 50b made of another metal having a comparatively low coefficient of thermal conductivity such as, for example, stainless steel and joined to the metal block 50a by means of brazing, screwing or welding. The heating block 50 has a plurality of holes 51 formed therein for receiving terminals provided on the ceramic substrate 1. The hot plate 52 is heated to a temperature, for example, of 240° to 250° C.

Figure 17:
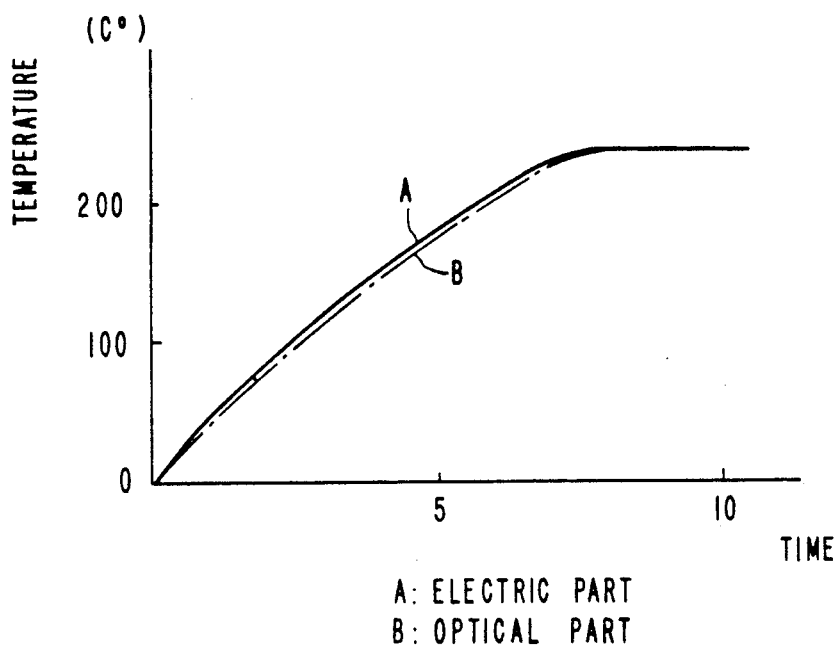
FIG. 17 is a graph showing heating curves of the optical parts and the electrical part of FIG. 16.

In the present embodiment, since the heating block 50 is composed of the metal block 50a having a high coefficient of thermal conductivity and the metal block 50b having a comparatively low coefficient of thermal conductivity and joined to the metal block 50a such that the metal block 50a having a high coefficient of thermal conductivity may be contacted with the rear face of a portion of the substrate 1 at which the optical parts are to be mounted and the metal block 50b having a comparatively low coefficient of thermal conductivity may be contacted with the rear face of another portion of the substrate 1 at which the electric part 8 is to be mounted in such a manner as described above. Heating curves of the optical parts and the electric part upon heating by the hot plate 52 can be made substantially same with each other as shown in FIG. 17 due to a difference in coefficient of thermal conductivity between the heating block portions 50a and 50b. Consequently, periods of time required until the optical parts and the electric part reach a temperature necessary for soldering become substantially same with each other. Accordingly, possible deterioration of the electric part by a thermal load is prevented.

Figure 18:
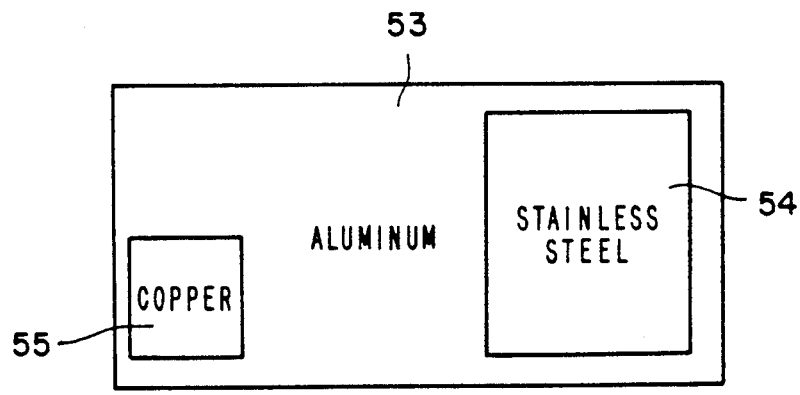
FIG. 18 is a plan view of another form of a heating block.
Figure 19:
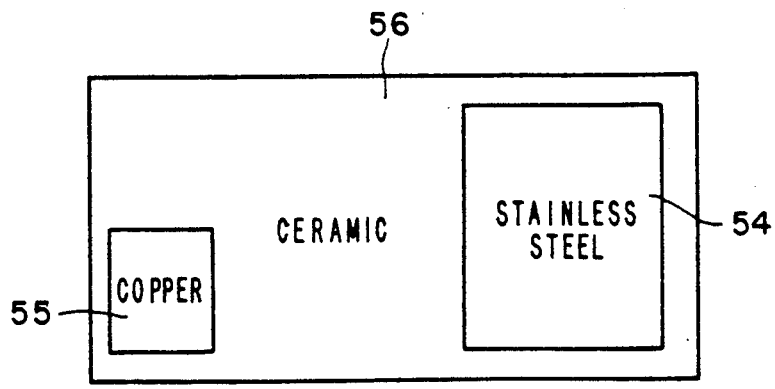
FIG. 19 is a plan view of a further form of a heating block.

FIG. 18 is a plan view of another form of such heating block. The heating block shown is constituted by joining or force fitting a stainless steel plate 54 having a low coefficient of thermal conductivity and a copper plate 55 having a particularly high coefficient of thermal conductivity to or into an aluminum plate 53 having a high coefficient of thermal conductivity. FIG. 19 is a plan view of a further form of such heating block. The heating block shown is constituted by joining or force fitting a stainless steel plate 54 having a low coefficient of thermal conductivity and a copper plate 55 having a particularly high coefficient of thermal conductivity to or into a ceramic plate 56 having a high coefficient of thermal conductivity.

In the heating blocks shown in FIGS. 18 and 19, the stainless steel plate 54 having a low coefficient of thermal conductivity is used to heat the electric part 8, and the copper plate 55 is used to heat an optical part having a particularly large internal heat capacity such as, for example, the fiber collimator 2 while the aluminum plate 53 or the ceramic plate 56 having a high coefficient of thermal conductivity is used to heat the other optical parts. The coefficients K of thermal conductivity of materials used in the heating blocks shown in FIGS. 18 and 19 are such as given below:

Stainless Steel: 24.5
Alumina Ceramic: 210
Aluminum: 236
Copper: 403

As described so far, according to a method of the present invention for fixing a cylindrical optical part, mechanical fixation of a photo-semiconductor collimator and electric connection of terminals of the photo-semiconductor collimator can be carried out by a single step, and accordingly, a process of production of an optical device is simplified. Further, according to another method of the present invention for collectively fixing an optical part and an electric part by soldering, an optical part and an electric part can be heated at one time at substantially the same rate. Accordingly, productivity is improved, and a an excessive thermal load to the electric part can be eliminated.

We claim:

1. A method of fixing on a substrate (10) a cylindrical optical part (15) which includes a lens (25), a photo-semiconductor device (23) having a light emitting portion or a light receiving portion located substantially at a focus position of said lens (25), and a plurality of terminals (16) connected to said photo-semiconductor device (23), comprising the steps of:

forming on said substrate (10) terminal arresting portions (11; 11a; 11b) each having a wiring pattern (13);

bending said terminals (16) such that each end portion thereof is arrested at said respective terminal arresting portions;

providing solder (17, 14) at a location of said substrate around said terminal arresting portions (11; 11a; 11b) and another location of said substrate at which said cylindrical optical part (15) is to be mounted;

positioning and holding said cylindrical optical part (15) on said substrate (10) by means of a positioning jig (19) having a V-shaped groove formed thereon with said solder (14) interposed between said cylindrical optical part (15) and said substrate (10);

heating said cylindrical optical part (15) and said substrate (10) in an integral relationship to melt said solder (17, 14); and leaving said cylindrical optical part (15) and said substrate (10) until the melted solder (17, 14) has solidified, thereby fixing said cylindrical optical part (15) to said substrate (10) and simultaneously connecting said terminals (16) of said cylindrical optical part (15) to said terminal arresting portion (11; 11a; 11b) of said substrate (10).

2. A fixing method as set forth in claim 1, wherein said terminal arresting portions are recesses (11; 11b) formed on said substrate (10).

3. A fixing method as set forth in claim 1, wherein said terminal arresting portions are projections (11a) formed on said substrate (10).

4. A method of fixing on a substrate (10) a cylindrical optical part (15) which includes a lens (25), a photo-semiconductor device (23) having a light emitting portion or a light receiving portion located substantially at a focus position of said lens (25), and a plurality of terminals (16) connected to said photo-semiconductor device (23), comprising the steps of:

providing solder (29, 14) at locations of said substrate (10) at which said terminals (16) are to be fixed and another location of said substrate (10) at which said cylindrical optical part (15) is to be mounted;

positioning and holding said cylindrical optical part (15) on said substrate (10) by means of a positioning jig (19) having a V-shaped groove formed thereon with said solder (14) interposed between said cylindrical optical part (15) and said substrate (10) while contacting a terminal pressing member (20) with wall faces of said V-shaped groove of said positioning jig (19) and simultaneously bending said terminals (16) extending from said cylindrical optical part (15) by means of said terminal pressing member (20) to press end portions of said terminals (16) against wiring patterns (28) on said substrate (10) with said solder (29) interposed therebetween;

heating said cylindrical optical part (15) and said substrate (10) in an integral relationship to melt said solder (29, 14); and leaving said cylindrical optical part (15) and said substrate (10) until the melted solder (29, 14) has solidified, thereby fixing said cylindrical optical part (15) to said substrate (10) and simultaneously connecting said terminals (16) of said cylindrical optical part (15) to said wiring patterns (28) on said 5. A fixing method as set forth in claim 4, wherein said terminal pressing member (20) has a semi-cylindrical upper face (21) and a lower face on which a plurality of grooves (22) are formed, the grooves corresponding in number to the number of said terminals (16) of said cylindrical optical part (15) to be fixed.

6. A method of fixing on a substrate (10) a cylindrical optical part (15) which includes a lens (25), a photo-semiconductor device (23) having a light emitting portion or a light receiving portion located substantially at a focus position of said lens (25), and a plurality of terminals (16) connected to said photo-semiconductor device (23), comprising the steps of;

forming a terminal pressing portion (32) in an integral relationship on a positioning jig (30) which has a V-shaped groove formed therein for positioning said cylindrical optical part (15) on said substrate (10);

providing solder (29, 14) at locations of said substrate (10) at which said terminals (16) are to be fixed and another location of said substrate (10) at which said cylindrical optical part (15) is to be mounted;

positioning and holding said cylindrical optical part (15) on said substrate (10) by means of said positioning jig (30) with said solder (14) interposed therebetween and simultaneously bending said terminals (16) extending from said cylindrical optical part (15) by means of said terminal pressing portion (32) of said positioning jig (30) to press end portions of said terminals (16) against wiring patterns (28) on said substrate (10) with said solder (29) interposed therebetween:

heating said cylindrical optical part (15) and said substrate (10) in an integral relationship to melt said solder (29, 14); and leaving said cylindrical optical part (15) and said substrate (10) until the melted solder (29, 14) has solidified, thereby fixing said cylindrical optical part (15) to said substrate (10) and simultaneously connecting said terminals (16) of said cylindrical optical part (15) to said wiring patterns (28) on said substrate (10).

7. A fixing method as set forth in claim 6, wherein said terminal pressing portion (32) of said positioning jig (30) has a plurality of grooves (33) formed thereon and corresponding in number to the number of said terminals (16) of said cylindrical optical part (15) to be fixed.

8. A method of fixing a cylindrical optical part (2, 6, 7) and an electric part (8) collectively on a substrate (1) by soldering, comprising the steps of:

providing solder at a location of said substrate (1) at which said cylindrical optical part (2, 6, 7) is mounted and another location of said substrate (1) at which said electric part (8) is mounted;

positioning and holding said cylindrical optical part (2, 6, 7) on said substrate (1) by means of a positioning jig (35) having a V-shaped groove formed thereon with solder interposed between said cylindrical optical part (2, 6, 7) and said substrate (1);

mounting said electric part (8) on said substrate (1) with solder interposed therebetween;

contacting a heating block (50) composed of a first portion (50a) made of a first substance having a high coefficient of thermal conductivity and a second portion (50b) made of a second substance having a relatively low coefficient of thermal conductivity compared with the first substance with a rear face of said substrate (1) such that said first portion (50a) made of the first substance having a high coefficient of thermal conductivity makes contact with the reverse face of a location of said substrate (1) at which said cylindrical optical part (2, 6, 7) is mounted and said second portion (50b) made of the second substance having a low coefficient of thermal conductivity makes contact with the reverse face of another location of said substrate (1) at which said electric part (8) is mounted;

heating said solder by a heating means (52) by way of said heating block (50) and said substrate (1) to melt said solder; and leaving said cylindrical optical part (2, 6, 7), said electric part (8), and said substrate (1) until the melted solder is solidified, thereby fixing said cylindrical part (2, 6, 7) and said electric part (8) to said substrate (1) collectively by soldering.

9. A fixing method as set forth in claim 8, wherein said first heating block (50) is constituted by joining said portion (50a) made of the first substance having a high coefficient of thermal conductivity and said second portion (50b) made of the second substance having a low coefficient of thermal conductivity to each other.

10. A fixing method as claimed in claim 8, wherein said heating block (50) is constituted by force fitting said second portion (50b) made of the second substance having a low coefficient of thermal conductivity into said first portion (50a) made of the first substance having a high coefficient of thermal conductivity.

11. A fixing method as claimed in claim 8, wherein said heating block (50) is constituted by force fitting said first portion (50a) made of the first substance having a high coefficient of thermal conductivity into said second portion (50b) made of the second substance having a low coefficient of thermal conductivity.

* * * * *

UNITED STATES PATENT AND TRADEMARK OFFICE
CERTIFICATE OF CORRECTION

PATENT NO. : 5,028,111
DATED : July 2, 1991
INVENTOR(S) : Mitsuru Yumoto et al.

It is certified that error appears in the above-identified patent and that said Letters Patent is hereby corrected as shown below:

Col. 1, line 5, delete in its entirety.

Col. 5, lines 29 and 30, delete in their entirety and substitute therefor:

Col. 7, line 28, delete "and the";
line 42, change "member in which" to --member.--.

Col. 8, line 14, after "plurality" insert --of--;
line 33, after "plurality" insert --of--.

Col. 13, line 9, after "said" (second occurrence) insert --substrate (10)--.

Signed and Sealed this

Thirteenth Day of October, 1992

Attest:

DOUGLAS B. COMER

*Attesting Officer*  *Acting Commissioner of Patents and Trademarks*